United States Patent [19]

Azumi et al.

[11] Patent Number: 5,034,709
[45] Date of Patent: Jul. 23, 1991

[54] COMPOSITE ELECTRONIC COMPONENT

[75] Inventors: Takeshi Azumi; Hiroshi Morii; Yasuyuki Naito; Yoshiaki Kohno, all of Nagaokakyo, Japan

[73] Assignee: Murata Manufacturing Co., Ltd., Kyoto, Japan

[21] Appl. No.: 437,933

[22] Filed: Nov. 17, 1989

[30] Foreign Application Priority Data

Nov. 17, 1988 [JP] Japan .................................. 63-292091

[51] Int. Cl.$^5$ .......................... H03H 7/00; H01C 7/10
[52] U.S. Cl. .................................... 333/184; 333/185; 29/610.1; 428/138; 361/321
[58] Field of Search ............... 333/167, 184, 185, 181; 338/20, 21, 66, 204, 205; 428/138, 209, 901; 361/321 R; 29/602.1, 610.1, 612

[56] References Cited

U.S. PATENT DOCUMENTS

| | | | |
|---|---|---|---|
| 3,842,374 | 10/1974 | Schlicke | 333/182 |
| 4,675,772 | 6/1987 | Epstein | 361/111 X |
| 4,746,557 | 5/1988 | Sakamoto et al. | 333/184 X |
| 4,811,164 | 3/1989 | Ling et al. | 338/21 X |
| 4,918,570 | 4/1990 | Okamura et al. | 361/321 |

Primary Examiner—Eugene R. LaRoche
Assistant Examiner—Seung Ham
Attorney, Agent, or Firm—Wenderoth, Lind & Ponack

[57] ABSTRACT

A unitary composite electronic component having both a filter function and a surge voltage absorption function is arranged to have a varistor laminated body laid on top of an inductor laminated body and a capacitor laminated body, or at least one of them, and is baked so as to be integral in order to construct a laminated body. The unbaked varistor laminated body is provided with varistor electrodes, and the unbaked inductor laminated body is provided with an inductor conductive line and the unbaked capacitor laminated body is provided with capacitor electrodes, respectively. The above-described laminated body is provided at the sides thereof with external electrodes for properly connecting the above-described varistor electrodes with the inductor conductive line and the capacitor electrodes to obtain a composite electronic component having both a filter function and a surge voltage absorption function.

1 Claim, 2 Drawing Sheets

COMPOSITE ELECTRONIC COMPONENT

BACKGROUND OF THE INVENTION

The present invention relates to a composite electronic component, and more particularly, to a composite electronic component comprising a varistor having both a filter function and surge voltage absorption function.

Conventionally, a composite electronic component has been known in which elements which are different from each other, such as inductors and capacitors are laminated alternately to be integral whereby a filter function (high-frequency noise absorption function) is obtained.

In an ordinary electronic device, a surge voltage absorption function is demanded to protect the device itself from surge voltages, in addition to a filter function. But, composite electronic components having both a filter function and surge voltage absorption function have not so far existed, so that, in the conventional electronic device, apart from a composite electronic component with a filter function, a unitary varistor part having a surge voltage absorption function had to be incorporated into the electronic device itself to meet the demand.

SUMMARY OF THE INVENTION

Accordingly, it is a first object of the invention to provide a unitary composite electronic component having both a filter function and a surge voltage absorption function.

It is a second object of the invention to provide a composite electronic component designed to reduce number of parts as well as mounting space therefor.

DESCRIPTION OF THE PREFERRED EMBODIMENTS

Figure 1:
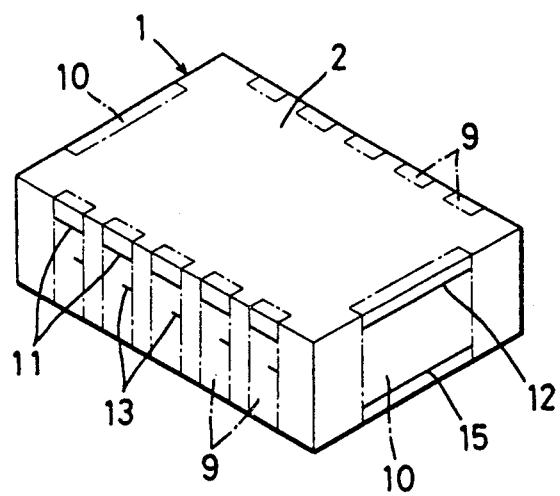
FIG. 1 is a perspective view of an external shape showing a first example of an electronic component in accordance with the present invention.
Figure 2:
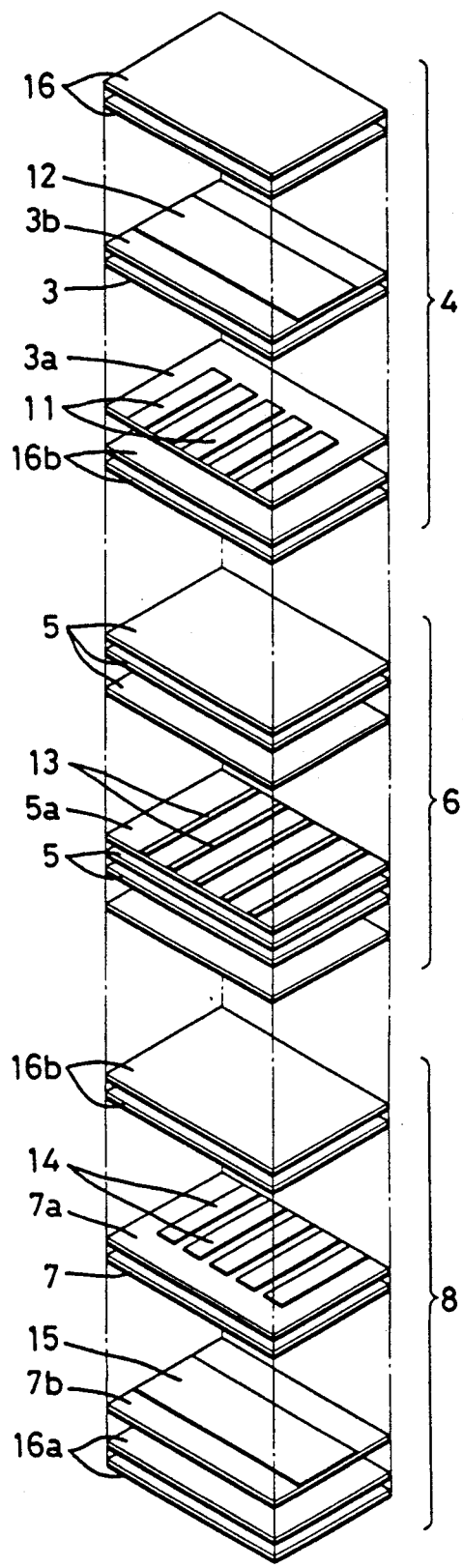
FIG. 2 is an exploded perspective view showing the internal structure of the first example shown in FIG. 1.
Figure 3:
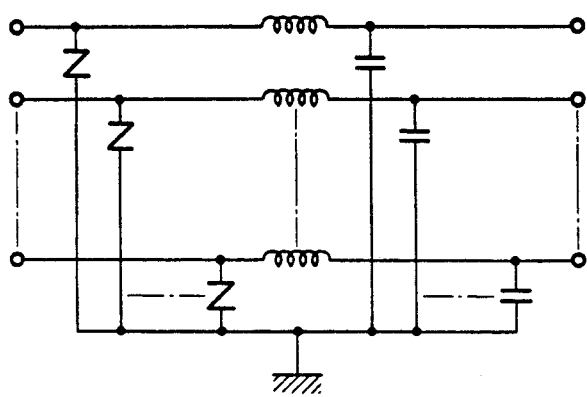
FIG. 3 is an equivalent circuit diagram of the first example shown in FIG. 1.

The electronic component 1, in the first example shown in FIGS. 1 through 3, is formed of a laminated body 2 which is substantially a rectangular parallelepiped in shape.

The laminated body 2 is constructed in the following way: an unbaked varist laminated body 4 is made of a plurality of varistor green sheets 3 . . . forming voltage-dependent nonlinear resistor layer, laid on top of another; an unbaked inductor laminated body 6 is made of a plurality of magnetic green sheets 5 . . . also laid on top of another; and, an unbaked capacitor laminated body 8 is made of a plurality of dielectric green sheets 7 . . . ; are then sequentially laminated and baked so as to be integral.

Inside said laminated body 2 are formed internal electrodes (to be explained later) having predetermined plane figures. At both side surfaces (the longer sides, in the drawing) of the laminated body 2 are formed the external electrodes 9, 9, and at both end surfaces (the shorter sides, in the drawing) thereof the external electrodes 10, 10, to be connected with input/output circuits and ground circuits, respectively.

Next, the method for manufacturing the composite electronic component shown in the example of the present invention is described below in due order. 1 First, the respective ceramic material, which are varistor material having the components $0.99\ ZnO + 0.005\ Pr_6O_{11} + 0.005\ Co_2O_3$, magnetic materials of $0.19\ NiO + 0.30\ ZnO + 0.05\ CuO + 0.48\ Fe_2O_3$, and dielectric materials of $0.5\ Pb(Mg_{\frac{1}{3}}Nb_{\frac{1}{70}})O_3 + 0.5\ Pb(Mg_{\frac{1}{2}}W_{\frac{1}{2}})O_3$, are provided, and to the respective ceramic materials is added 10 wt % of organic resin binder to be mixed. Then, using the known doctor blade method, various green sheets, several tens $\mu m$ thick, consisting of the respective components described above, are obtained, which are cut off to be formed into a plurality of varistor green sheets 3 . . . , magnetic green sheets 5 . . . , and dielectric green sheets 7 . . . , respectively, as shown in FIG. 2. 2 Then, by printing and applying conductive paste comprising mainly silver (Ag), electrode patterns having predetermined shapes are formed on the required number of respective green sheets. In other words, on one main surface of one green sheet 3a are formed a plurality of respective electrodes 11 . . . , disposed in parallel and spaced apart from each other, one respective end portion of which reaches the edge of one longer side (the lower side, in the drawing) of the sheet 3a. And, on the other varistor green sheet 3b is formed, at the main surface thereof, a unitary common electrode 12, disposed opposite to the above-described respective electrodes 11 . . . , both end portions of which reach both edges of the shorter sides of the sheet 3b. Similarly, on one magnetic green sheet 5a are formed, at one main surface thereof, a plurality of internal electrodes 13 . . . , both end portions of which reach both edges of the longer sides of the sheet 5a, spaced apart from each other and disposed in parallel. Also, on one dielectric green sheet 7a are formed, at one main surface thereof, a plurality of internal electrodes 14 . . . , disposed in parallel and spaced apart from each other, one respective end portion of which reaches the edge of one longer side (the upper side, in the drawing), while on the other dielectric green sheet 7b is formed, at one main surface thereof, a unitary common electrode 15, disposed opposite to the above-described respective internal electrodes 14 . . . , both end portions of which reach both edges of the shorter sides of the sheet 7b.

In FIG. 2, the numbers and the positions of the internal electrodes 13, 14 formed on the magnetic green sheet 5a and the dielectric green sheet 7a, respectively, correspond to those of the respective electrodes 11 . . . on the varistor green sheet 3a. But, it is not always necessary for the numbers and the positions of the electrodes 11, 13 and 14 to correspond to each other. 3 Next, as shown in FIG. 2, the varistor green sheets 3a, 3b, on which respective electrodes 11 . . . and the common electrode 12 are formed respectively, and the varistor green sheets 3 . . . having no electrode pattern thereon, are laminated to each other to construct the unbaked varistor laminated body 4. The magnetic green sheet 5a having the internal electrodes 13 . . . on the surface thereof and the varistor green sheets 5 . . . having no electrode thereon, are laminated to each other to construct the unbaked inductor laminated body 6. Similarly, the dielectric green sheets 7a, 7b, on which the internal electrodes 14 . . . and the common electrode 15 are formed respectively, and the dielectric green sheet 7 . . . having no electrode pattern thereon, are laminated to each other to construct the unbaked capacitor laminated body 8. Hence, the unbaked varistor laminated body 4, the unbaked inductor laminated body 6 and the unbaked capacitor laminated body 8 are laid on top of one another and press bonded using a pressing device (not shown), thus forming the unbaked compact of the laminated body 2.

In FIG. 2, the green sheets 16 . . . having respectively identical configuration are laminated in the places: above the unbaked varistor laminated body 4, body 6, between the unbaked inductor laminated body 6 and the unbaked capacitor laminated body 8, and under the unbaked capacitor laminated body 8. While it does not matter what materials are used for these green sheets 16 . . . , the dielectric green sheets are preferably used for the green sheets 16a . . . to be arranged under the unbaked capacitor laminated body 8. Also, the green sheets 16b . . . which are to be arranged between the unbaked varistor laminated body 4 and the unbaked inductor laminated body 6, and between the unbaked inductor laminated body 6 and the unbaked capacitor laminated body 8 may be omitted. 4 In addition, this unbaked body is heated at about 1,100° C. for 2 hours in air, so that it is baked to be integral to form the laminated body 2 comprising a varistor, the inductor and the capacitor. Then, the conductive paste consisting mainly of silver (Ag) is applied and printed, thereby forming the external electrodes 9, 9. These electrodes 9, 9 connect mutually and suitably the respective electrodes 11 . . . of the varistor and the internal electrodes 13 . . . of the inductor, both exposed at one side face of the laminated body 2, and also connect in the same way the internal electrodes 13 . . . of the inductor and the internal electrodes 14 . . . of the capacitor similarly exposed on the other side thereof. In addition, using the same conductive paste as described above, the external electrodes 10, 10 are formed thus connecting mutually the common electrodes 12, 15 of the varistor and the capacitor that are being exposed at the end surface of the laminated body 2.

The first example of the invention so far described has illustrated the construction of the laminated body 2 of the composite electronic component 1 obtained through the processes of lamination and integral baking of the unbaked varistor laminated body 4, the unbed inductor laminated body 6 and the unbaked capacitor laminated body 8, but the scope of application of the present invention is not limited to the above-described construction.

Figure 5:
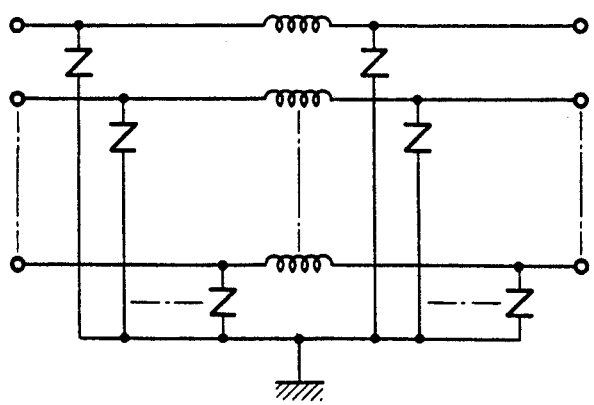
FIG. 5 is an equivalent circuit diagram of the second example.
Figure 4:
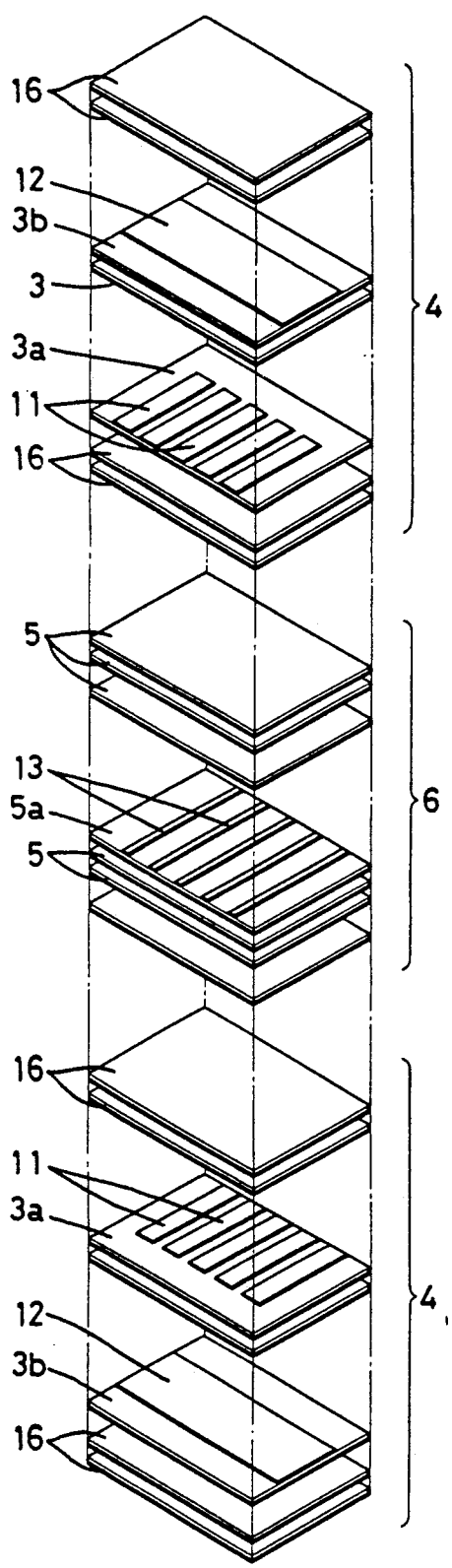
FIG. 4 is an exploded perspective view showing the internal structure of the laminated body of a second example in accordance with the present invention.

In other words, the second example is shown in FIGS. 4 and 5, for example, in which the unbaked inductor laminated body 6 is sandwiched between a pair of unbaked varistor laminated bodies 4, 4 arranged vertically opposite each other, and baked to be integral, thus causing the varistors and inductor to be made up to obtain the laminated body 2 of the composite electronic component 1.

Figure 6:
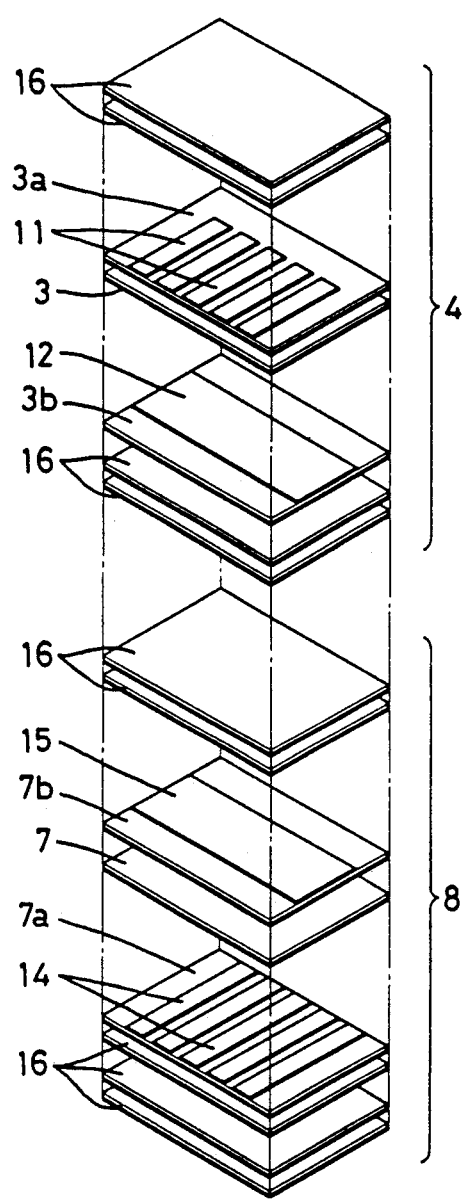
FIG. 6 is an exploded perspective view the internal structure of the laminated body of a third example in accordance with the present invention.
Figure 7:
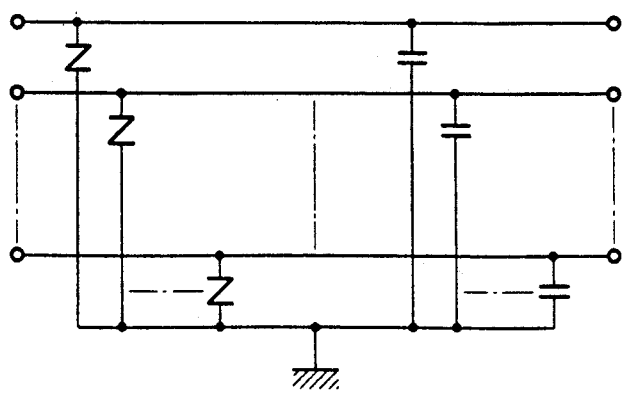
FIG. 7 is an equivalent circuit diagram of the third example.

Needless to say, it is possible to construct the laminated body 2 consisting of the varistor and the capacitor by laminating the unbaked varistor laminated body 4 and the unbaked capacitor laminated body 8 to be baked in an integral manner, as shown in FIGS. 6 and 7 as the third example. In addition, the varistor electrode of the voltage-dependent nonlinear resistor layer to be formed at both sides thereof and the capacitor electrode of the dielectric layer, at both sides thereof, may as well be at least one each in number, and at one side thereof, respectively, and are not limited to the above-described example.

As explained above using the examples, according to the present invention, a unitary composite electronic component is obtained which has both a filter function and a surge voltage absorption function, thus doing without conventional use of the two separate components, thereby reducing both the number of parts used and the mounting space therefor.

We claim:

1. A composite electronic component formed of a laminated body obtained through processes upon an unbaked varistor layer, in which at least one varistor electrode is formed on a voltage-dependent nonlinear resistor layer at both sides thereof in an opposite manner, and is laid on top of both an unbaked inductor layer, in which at least one inductor conductive line is formed inside a magnetic layer, and an unbaked capacitor layer, in which at least one capacitor electrode is formed on a dielectric layer at both side thereof in an opposite manner, and the layers are baked so as to be integral; and in which said laminated body is provided with external electrodes at the sides thereof for connecting said varistor electrodes, said at least one inductor conductive line, and said capacitor electrodes.

* * * * *